(12) United States Patent
Yan

(10) Patent No.: US 6,466,093 B1
(45) Date of Patent: Oct. 15, 2002

(54) LOW VOLTAGE LOW THD CMOS AUDIO (POWER) AMPLIFIER

(75) Inventor: Shouli Yan, College Station, TX (US)

(73) Assignee: Texas Instruments Incorporated, Dallas, TX (US)

(*) Notice: Subject to any disclaimer, the term of this patent is extended or adjusted under 35 U.S.C. 154(b) by 15 days.

(21) Appl. No.: 09/664,901

(22) Filed: Sep. 19, 2000

(51) Int. Cl.[7] .................................................. H03F 3/45
(52) U.S. Cl. ....................................................... 330/253
(58) Field of Search ................................. 330/253, 255, 330/261

(56) References Cited

U.S. PATENT DOCUMENTS 5,337,007 A * 8/1994 Barrett et al. ................ 330/253

* cited by examiner

*Primary Examiner*—Steven J. Mottola
(74) *Attorney, Agent, or Firm*—J. Dennis Moore; W. James Brady, III; Frederick J. Telecky, Jr.

(57) ABSTRACT

A low voltage low THD CMOS audio power amplifier (60) which can work at lower supply voltage with lower THD is presented. A Class AB input stage (40) is provided that can be used in the extremely low THD circuit (60). Compared to a conventional differential input stages (30), for a given quiescent current consumption, the Class AB input stage (40) achieves a much larger output dynamic current and a higher slew rate. In addition, the input stage (40) achieves a flat signal/distortion versus frequency characteristic. A Class AB output stage (80) has a higher over-drive gate-source voltages for the output transistors and thus has a higher driving capacity as compared to a conventional output stage (70) making it suitable for low voltage CMOS designs operable at supply voltages as low as 1.5 volts.

1 Claim, 7 Drawing Sheets

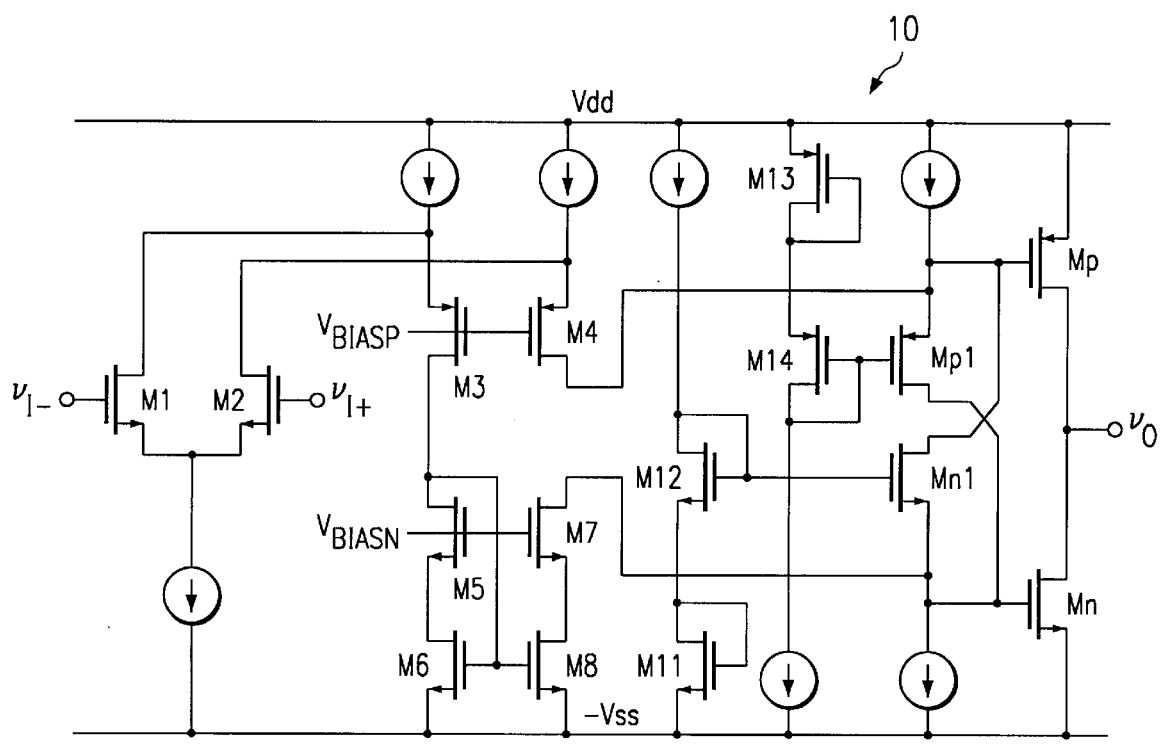
FIG. 1 *(PRIOR ART)*
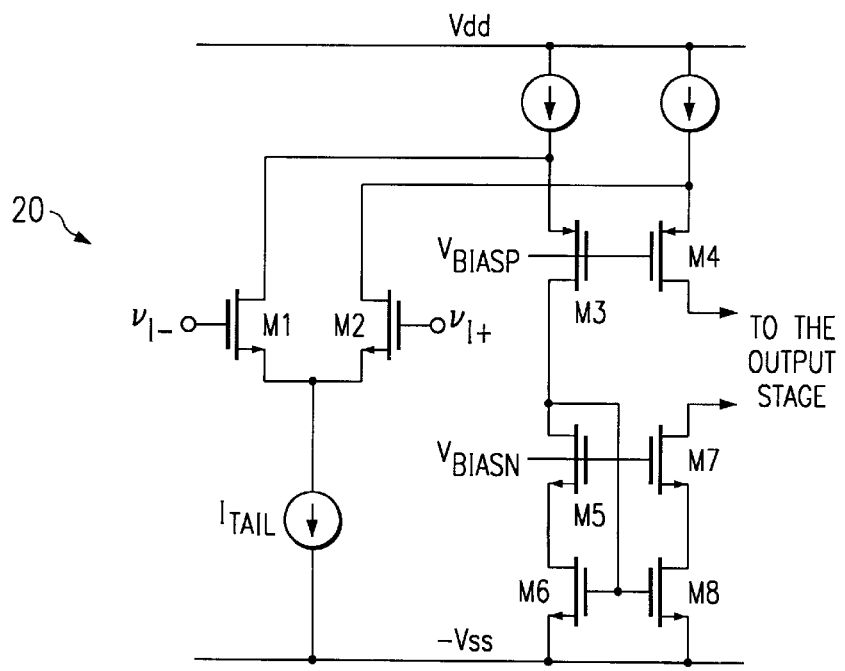
FIG. 2 *(PRIOR ART)*

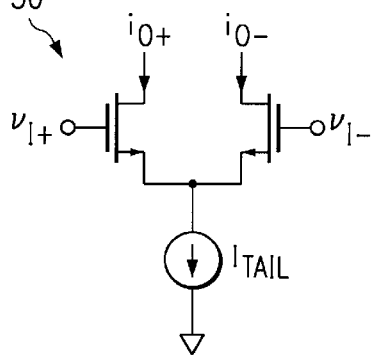
FIG. 3a
(CONVENTIONAL)
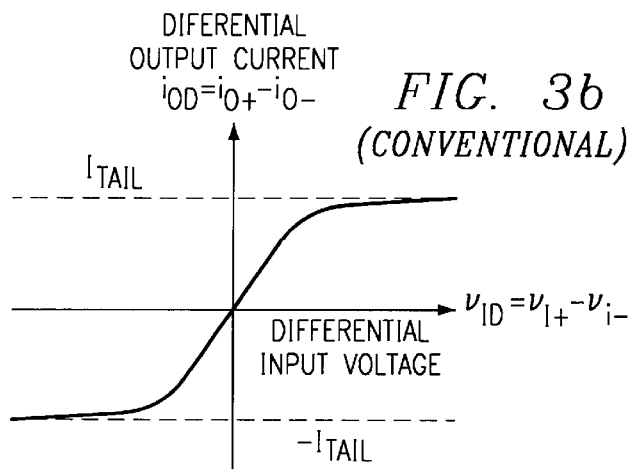
FIG. 3b
(CONVENTIONAL)
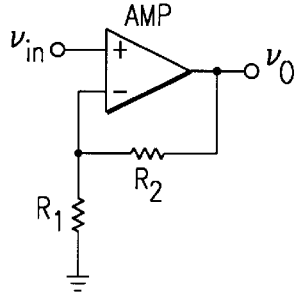
FIG. 3c
(CONVENTIONAL)

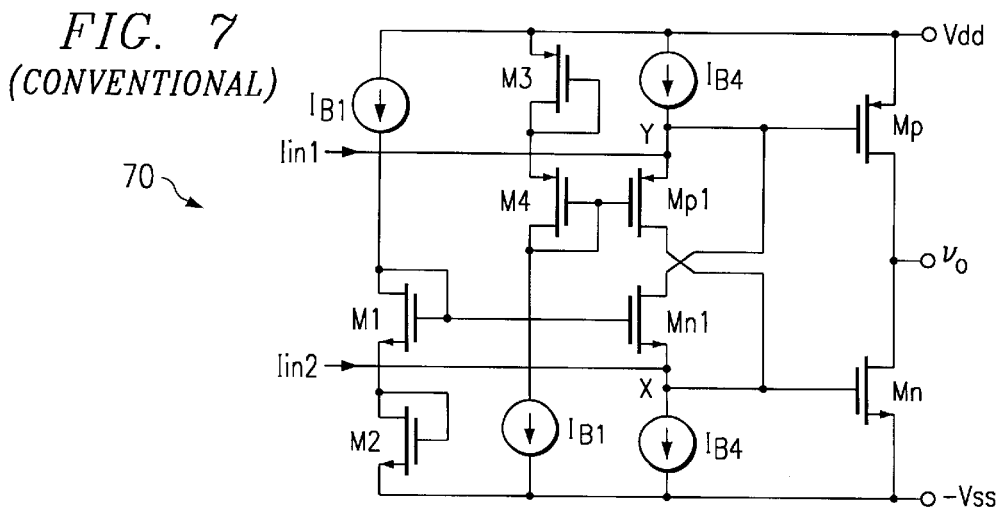
FIG. 7 (CONVENTIONAL)

LOW VOLTAGE LOW THD CMOS AUDIO (POWER) AMPLIFIER

FIELD OF THE INVENTION

The present invention is generally related to CMOS amplifier circuits, and more particularly to Class AB input stages and Class AB output stages useful in low voltage CMOS audio power amplifiers.

BACKGROUND OF THE INVENTION

Audio power amplifier circuits are widely used in mixed-signal integrated circuit (IC) products. Typically, low voltage CMOS audio power amplifiers are used as they consume relatively low power and operate at a low supply voltage of portable electronic equipment.

Referring to FIG. 1, there is shown at 10 a schematic of a conventional CMOS audio power amplifier. This conventional design includes an input stage 20 having a simple differential pair of MOS transistors, and a differential to single-ended conversion circuitry, as shown in FIG. 2. The shortcoming of the structure is that the maximum output current is $I_{TAIL}$, as shown at 30 in FIG. 3(a), FIG. 3(b) and FIG. 3(c), thus the slew rate condition will occur when a large fast transient is applied at the input of the MOS differential pair. The direct consequences are that the amplifier output is slew rate limited, and that the highest frequency that the amplifier can handle is inversely proportional to the output amplitude.

With regards to output stages, the output stages are typically classified into two categories depending on how the quiescent current is controlled, i.e. (i) without feedback loop (or, feedforward quiescent current control), and (ii) with feedback loop. Output stages having a feedback loop have reduced speed, which can degrade the phase margin of the signal path, and even create stability problems, due to the feedback loop.

There is a desire for a low voltage amplifier with an improved low total harmonic distortion (THD), hense, an improved signal/distortion ratio performance for a given quiescent current consumption, and which may operate at a reduced supply voltage. Specifically, there is a desire for an improved input stage having a much larger output dynamic current and hence a higher slew rate. There is also a desire for an Class AB output stage having a faster speed and a low crossover distortion at low supply voltage, whereby the circuit is stable to eliminate problems introduced by a quiescent feedback current control loop.

SUMMARY OF THE INVENTION

The present invention achieves technical advantages as a low voltage low THD CMOS audio (power) amplifier having a Class AB input stage and a low voltage Class AB output stage.

In the Class AB input stage, voltage buffers are provided to help drive each of the MOS transistors such that they can sink a large amount of current, such that the output current is virtually not limited. As compared to conventional differential pairs of MOS transistors, for the same quiescent current consumption, the present invention achieves a much larger output dynamic current, and thus a higher slew rate. In addition, the input stage of the present invention has a flat signal/distortion versus frequency characteristic, thus achieving a signal/distortion performance significantly better than the conventional design for the same current consumption.

The Class AB output stage of the present invention works at a reduced supply voltage while having a high driving capability, and has a low crossover distortion. This structure is always stable, without worrying about problems introduced by the quiescent feedback control loop. The output stage has a higher over-drive gate-source voltage for the output transistors, and thus has a higher driving capacity allowing the circuit to operate more suitably at low voltages which is desired in low voltage mixed-signal CMOS design, such as 1.8 volt or even 1.5 volt architectures.

BRIEF DESCRIPTION OF THE DRAWINGS

FIG. 1 is a schematic of a conventional Class AB input stage;

FIG. 2 is a schematic of a conventional differential input stage with differential to single ended conversion circuitry;

FIG. 3A is an simplified representation of the conventional input structure shown in FIG. 2;

FIG. 3B illustrates the nonlinear input-output transfer characteristic of the conventional differential input pair of FIG. 3A;

FIG. 3C illustrates a conventional amplifier receiving the non-linear differential voltage swing shown in FIG. 3B;

FIG. 7 is a schematic of a conventional output stage;

DETAIL DESCRIPTION OF THE PREFERRED EMBODIMENT

Referring now to FIG. 4(a)–FIG. 4(e), there is shown at 40 a first preferred embodiment of the present invention including a Class AB input stage suitable for use in a low voltage low THD amplifier.

Figure 4A:
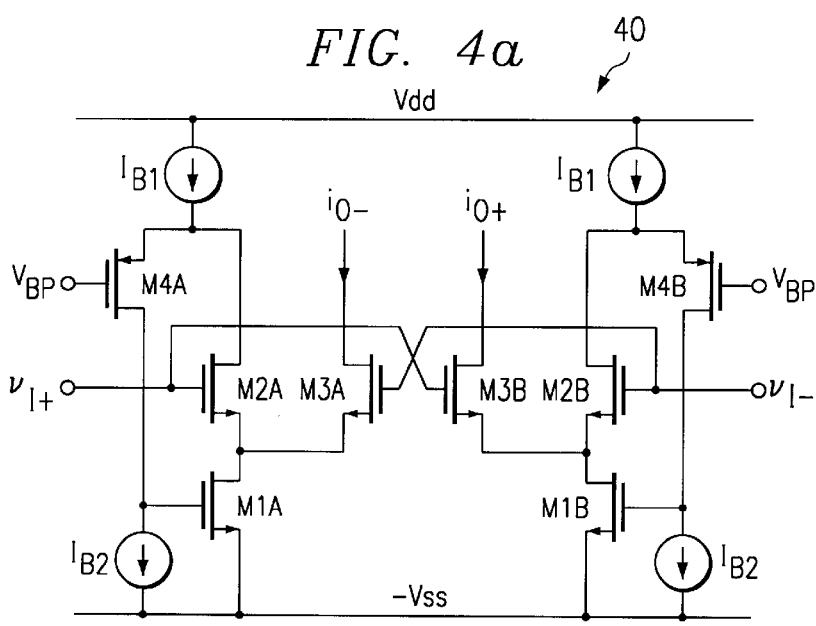
FIG. 4A is a schematic of a Class AB input stage of the present invention.
Figure 4B:
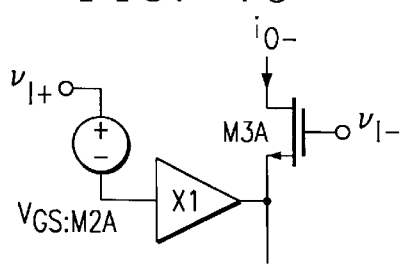
FIG. 4B is the equivalent circuit of the left half of the circuit shown in FIG. 4A depicting a voltage buffer which is formed by transistors M1A, M2A and M4A.
Figure 4C:
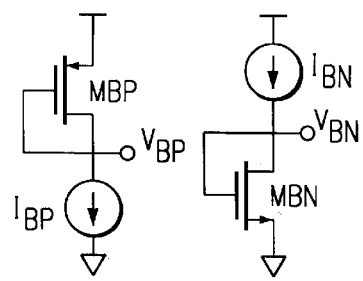
FIG. 4C illustrates bias generation circuits for the gate bias voltages for the N and P casscode structures of FIG. 4A.
Figure 4D:
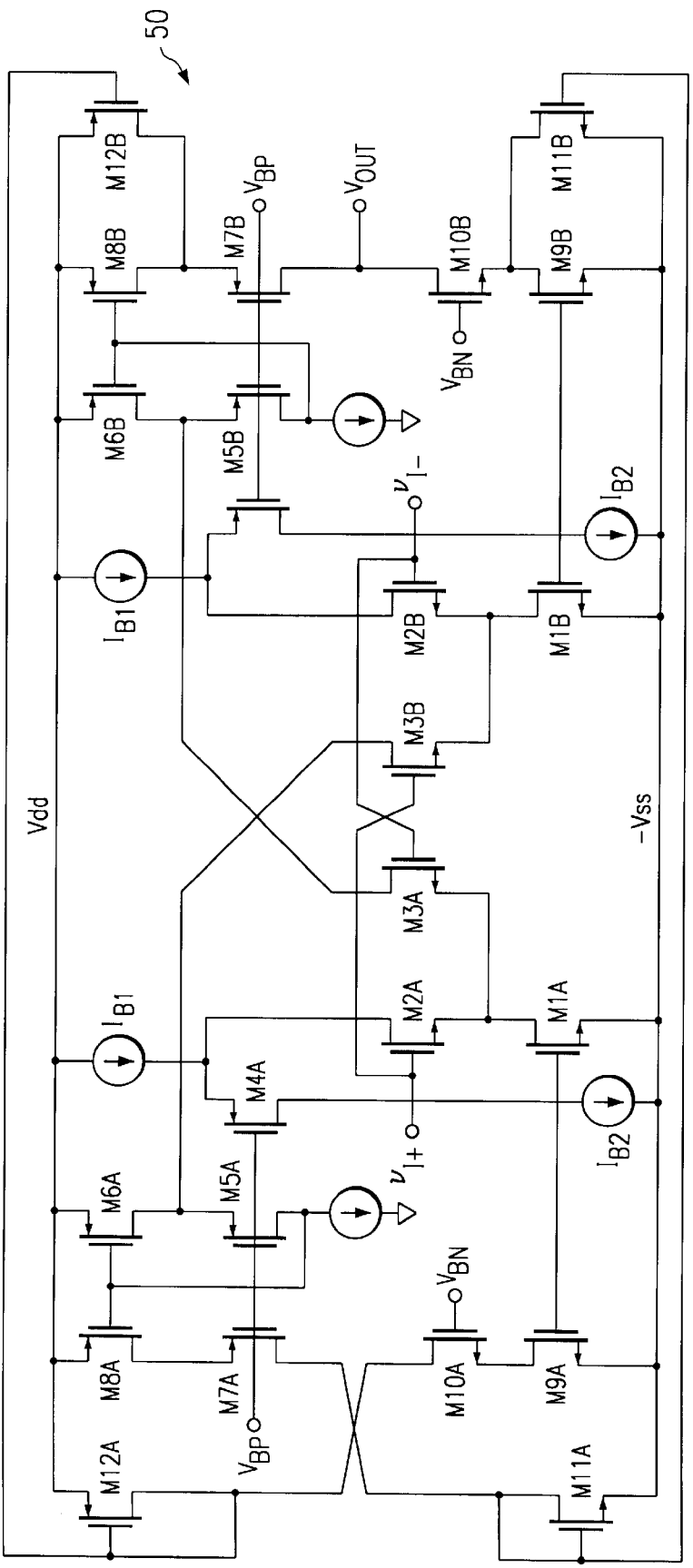
FIG. 4D illustrates the whole Class AB input stage with differential to single-ended circuitry of the present invention.

The working principle of the Class AB input stage 40 of the present invention is shown in FIG. 4(a), where the equivalent circuit of the left half is redrawn in FIG. 4(b). The whole schematic of the Class AB input stage is depicted in FIG. 4(d). Voltages $V_{BN}$ and $V_{BP}$ in FIG. 4(a,d) are gate bias voltages for the N and P cascode structures respectively, which are generated with the circuits as depicted in FIG. 4(c). The Class AB input stage 40 comprises a differential pair of MOS transistors M3A and M3B each having a respective voltage buffer which is formed by transistors (M1A, M2A and M4A) and (M1B, M2B, and M4B), respectively. In one practical design, low $V_T$ transistors are used for transistors M2A, M2B, M3A and M3B to improve the input common-mode voltage swing.

If input $v_{I-}$ is higher than input $v_{I+}$, transistor M3A tends to conduct harder than transistor M3B which tends to cut off because the voltage buffer comprising MOS transistor M2A, with a level shift of one $V_{GS}$ as shown in FIG. 4(b), can sink a large amount of current, and the output current of $i_{O-}$ conducting through transistor M3A is virtually not limited.

If input $v_{I+}$ is higher than input $v_{I-}$, transistor M3A tends to cut off and transistor M3B conducts harder. When $v_{I+} - v_{I-} > V_{GSQ,M3} - V_T$, where $V_{GSQ,M3}$ is the gate-source bias voltage of transistor M3A in quiescent condition, transistor M3A is completely cut off.

The right half of the circuit is just the mirror of the left half. Each half circuit works together with the other in a push-pull fashion, thus, the output current ($i_{O+} - i_{O-}$) can have a large excursion.

Figure 4E:
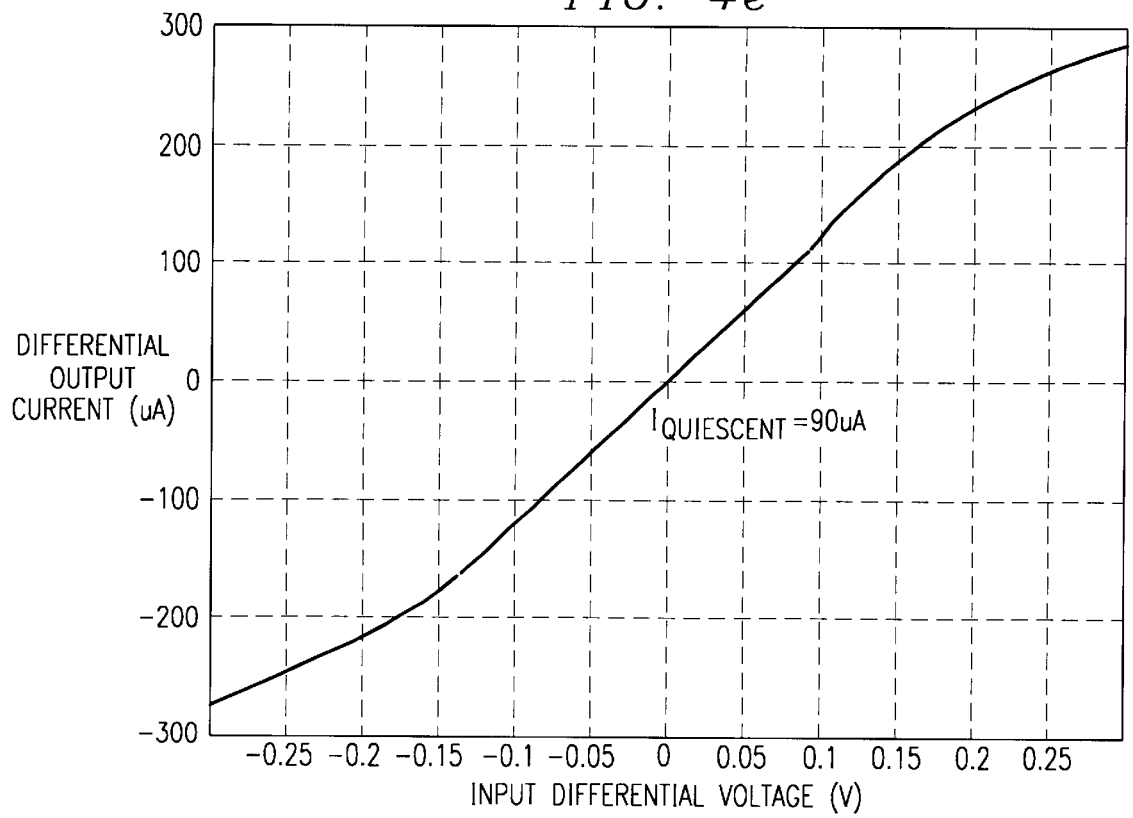
FIG. 4E illustrates the input/output characteristic of the input structure of FIG. 4A.

FIG. 4(e) is the input-output characteristic of the input structure of FIG. 4(a) as simulated by TI Spice depicting the large differential output current achieved with the Class AB input stage 40 according to the first embodiment of the present invention.

Referring back to FIG. 3(a), conventional designs use a simple differential pair as the input stage as shown at 30. The shortcoming of this structure 30 is that its maximum output current is $I_{TAIL}$, thus, the slew rate condition of the circuit will occur when a fast large transient happens at the input. The direct consequence is that the amplifier output is slew rate limited, and the highest frequency of the input signal that the amplifier can handle is inversely proportional to the output amplitude and is:

$$f_{max} = \frac{S_R}{2\pi A_{out}}$$

where, $S_R$ is the slew rate of the amplifier, and $A_{out}$ is the output amplitude. Usually, $$S_R = \frac{I_{TAIL}}{C_M}$$

in which $I_{TAIL}$ is the tail current of the differential pair, and $C_M$ is the value of the Miller frequency compensation capacitor.

When the amplifier 30 works in the slew rate condition, the output can not follow the transient of the input signal, and a large distortion will occur.

Even when the input signal frequency is less than $f_{max}$, because of the non-linear transfer characteristic of the differential pair as graphically shown in FIG. 3(b), there is a non-linear differential voltage swing at the input of the differential pair and also the input of the whole amplifier Amp depicted in FIG. 3(c), which is a non-linear function of the input voltage $v_{in}$. Thus, harmonic distortion is introduced.

For operational amplifiers, by ignoring higher order non-dominant poles, the small signal voltage gain by 1$^{st}$ order approximation is:

$$A(s) = \frac{A_0}{1+s/p}$$

where $A_0$ is the DC gain of the amplifier, and p is the dominant pole of the amplifier.

For frequencies much higher than pole p, the above equation can be further approximated as:

$$A(s) \approx \frac{\omega_u}{s},$$

where $\omega_u = A_0 p$ is the unity-gain (angular) frequency of the amplifier.

Suppose the unity-gain frequency (gain bandwidth) of the amplifier is 1 MHz. At 20 kHz, the gain of this amplifier decreases to 50, which is not large enough to depress the harmonic distortion. If the output is 2V, the input differential error voltage is 40 mV, large enough to introduce considerable harmonic distortion because of the non-linear transfer characteristic, as shown in FIG. 3 (b).

Figure 5:
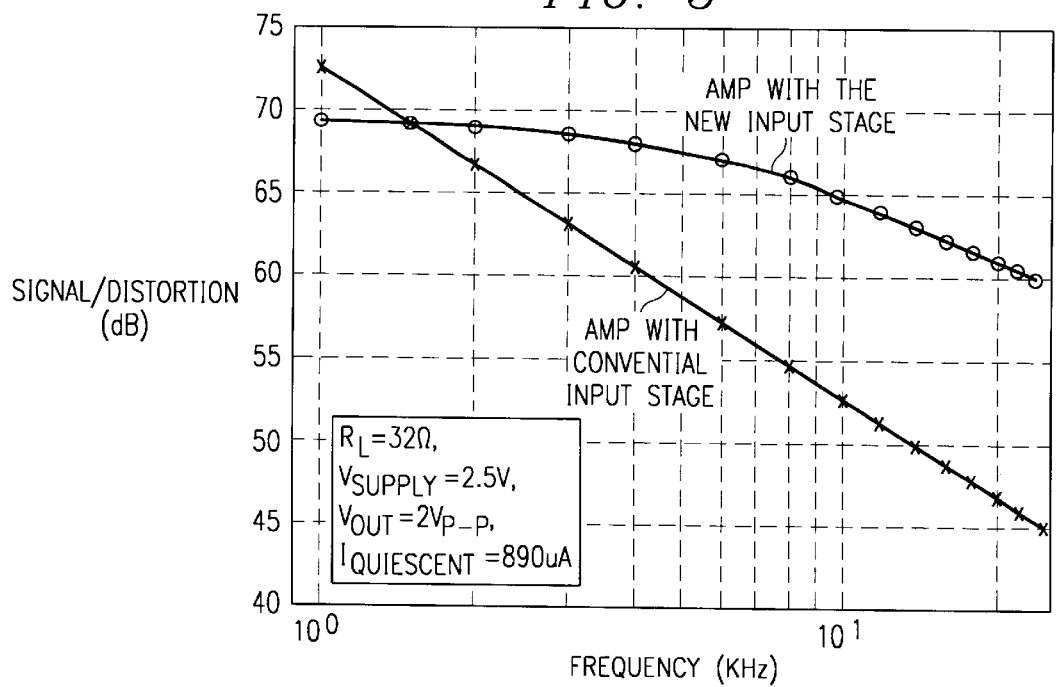
FIG. 5 illustrates a TI Spice simulation of the signal/distortion ratio performance of the present invention as opposed to a conventional differential input stage.

FIG. 5 shows TI Spice simulation results of signal/distortion ratio performance of amplifiers with this new input stage 40 v.s. conventional differential input stage 10. With the new class AB input stage 40, a 14.1 dB advantage of signal over distortion at 20 kHz is obtained with the same load, supply voltage, output voltage, and quiescent current.

Figure 6A:
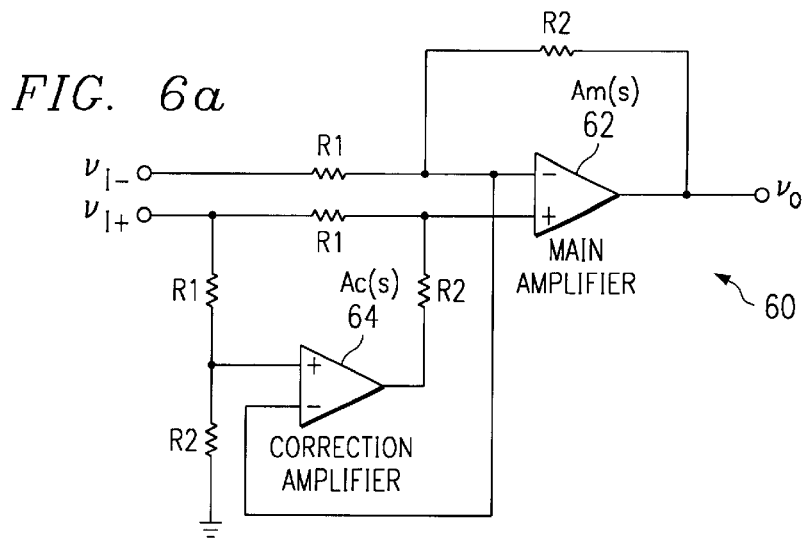
FIG. 6A illustrates the Class AB input stage used in an extremely low THD CMOS audio power circuit.
Figure 6B:
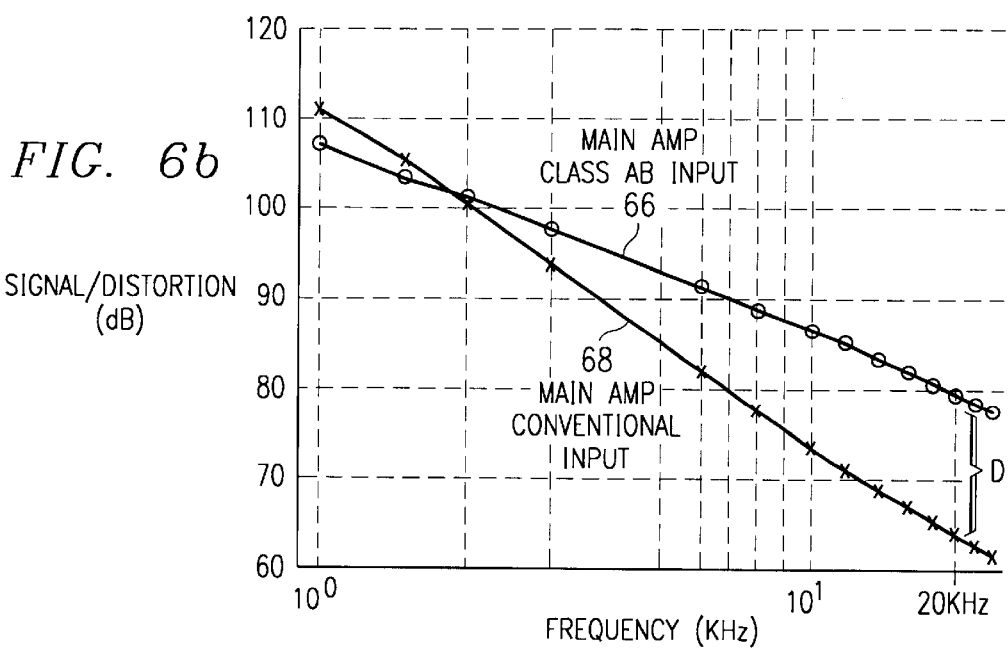
FIG. 6B illustrates a TI Spice simulation results of signal/distortion performance for the circuit of FIG. 6A in view of conventional differential pair input structures.

The novel class AB input stage 40 is further used in an extremely low THD structure 60 such as an audio amplifier as shown in the schematic in FIG. 6 (a), and shown in commonly assigned U.S. patent application Ser. No. 09/615,377, filed Jul. 13, 2000 entitled "Apparatus and Method for Electrical Signal Amplification", the teachings of which are included herein by reference. TI Spice simulation results of signal/distortion performance are shown in FIG. 6(b) for the novel class AB input stage 40 of the present invention as compared to the conventional differential pair 10 as the input stage 46 of the main amplifier (first 9 harmonics), with:

Vsup=2.5V

Vout=2.0Vp-p $I_Q$=960 μA

Load=32Ω∥20 pF

For comparison, the main amplifier 62 uses different input stage structures, i) the new class AB input structure 40, and ii) the conventional differential pair 10. The correction amplifier 64 uses conventional differential pair input structure for two cases. In FIG. 6(b), the top curve 66 is the signal/distortion characteristic with the class AB input structure 40 of the present invention as the input stage of the main amplifier, and the bottom curve 68 is that with conventional differential input structure 10.

FIG. 6(b) shows at D that a 15.4 dB signal/distortion advantage is obtained at 20 KHz for the class AB input structure 40 of the present invention as the main amplifier input stage over a conventional differential pair 10, with the same supply voltage (2.5V), output voltage swing (2Vp-p), total quiescent current (960 μA), and load condition (32Ω∥20 pF).

By TI Spice simulation, the noise of this structure 40 is about 3 dB higher than the conventional design 10, due to more transistors involved in this new structure. This is not a problem for most of the design if the noise specification is not extremely stringent.

Low Voltage Class AB Output Stage

Figure 8A:
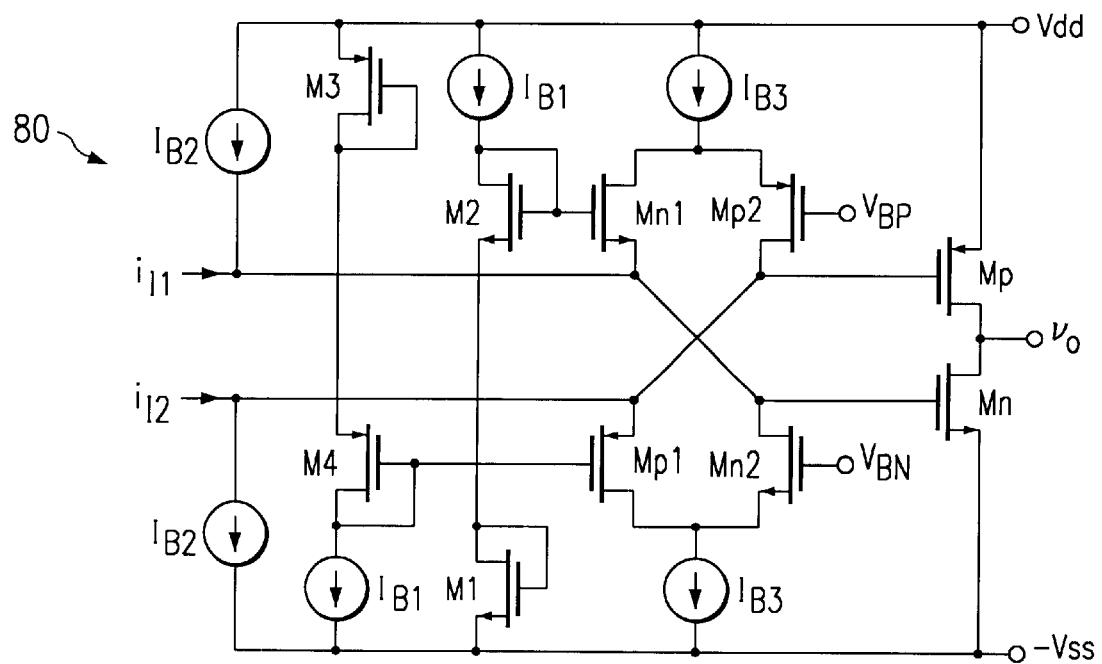
FIG. 8A illustrates the low voltage Class AB output stage of the present invention.
Figure 8B:
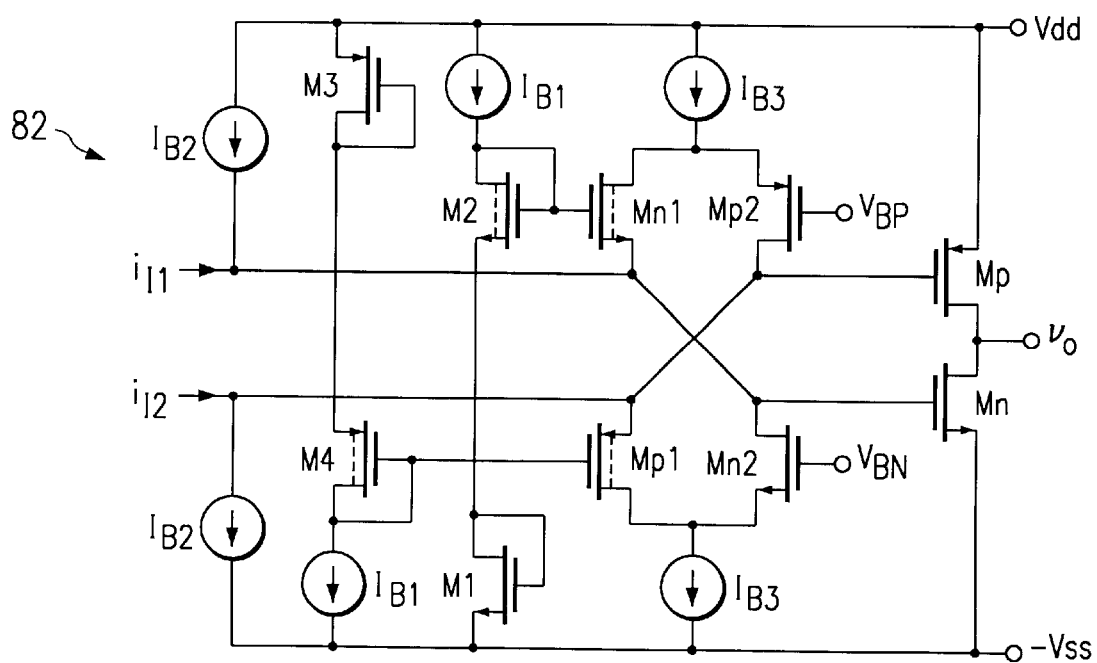
FIG. 8B illustrates the low voltage Class AB output stage with low $V_T$ transistors of the present invention.

A conventional output stage is shown at 70 in FIG. 7, and the low voltage Class AB output stage according to a second embodiment of the present invention is shown at 80 in FIG. 8(*a*), and at 82 in FIG. 8(*b*). This Class AB output stage 80 and 82 has an accurate control of the quiescent and a good Class AB control behavior.

Quiescent Current Control

For the N-channel MOS transistors, M1, M2, Mn1 and Mn:

$$V_{GS,M1} + V_{GS,M2} = V_{GS,Mn1} + V_{GS,Mn}$$

In the following discussion, the N-channel side of the circuit 80 and 82 is discussed because of the topological symmetry of the circuit 80, where the equations also apply to the P-side circuitry.

By $1^{st}$ order approximation, ignoring bulk effect and the channel length modulation effect, and assuming that the FET quadratic characteristic stands and the P side and N side of the circuit 70 are symmetrical, the following equation applies:

$$\sqrt{\frac{I_{D,M1}}{(W/L)_{M1}}} + \sqrt{\frac{I_{D,M2}}{(W/L)_{M2}}} = \sqrt{\frac{I_{D,Mn1}}{(W/L)_{Mn1}}} + \sqrt{\frac{I_{D,Mn}}{(W/L)_{Mn}}},$$

Note that;

$$I_{D,M1} = I_{D,M2} = I_{B1}, \; I_{D,Mn1} = \frac{I_{B3} - I_{B2}}{2}, \; \text{and} \; I_{D,Mn} = I_{Q,OUT},$$

so:

$$I_{Q,OUT} = (W/L)_{Mn} \left( \sqrt{\frac{I_{B1}}{(W/L)_{M1}}} + \sqrt{\frac{I_{B1}}{(W/L)_{M2}}} - \sqrt{\frac{I_{B3} - I_{B2}}{2(W/L)_{Mn1}}} \right)^2 \quad (5)$$

To make the N side and P side symmetrical, the following equation applies:

$$\frac{(W/L)_{M2}}{(W/L)_{M4}} = \frac{(W/L)_{M1}}{(W/L)_{M3}} = \frac{(W/L)_{Mn1}}{(W/L)_{Mp1}} = \frac{(W/L)_{Mn2}}{(W/L)_{Mp2}} = \frac{(W/L)_{Mn}}{(W/L)_{Mp}} = \frac{K_{P,P}}{K_{P,N}}$$

where $K_{P,P}$ and $K_{P,N}$ are transconductance coefficients of P and N MOS transistors respectively, and $K_P = \mu_n C_{ox}$.

To make the circuit 80 and 82 have a more predictable quiescent current, where:

$$L_{M2} = L_{Mn1}, \; L_{M1} = L_{Mn} \; \text{and,} \; \frac{I_{B1}}{W_{M2}} = \frac{I_{B3} - I_{B2}}{2W_{Mn1}},$$

the output current is:

$$I_{Q,OUT} = \frac{W_{Mn}}{W_{M1}} I_{B1}$$

where $L_{Mx}$ and $W_{Mx}$ denote the length and width of transistor Mx, and $I_{Q,OUT}$ is the quiescent current of output transistors Mn and Mp in FIG. 8(*a*) and FIG. 8(*b*).

Note that the above equation does not depend on the quadratic characteristic of FET transistors. In this way, there may be a well-defined quiescent current, which is only weakly affected by the supply voltage due to the channel length modulation effect. Normally, drain current just increases slightly as the $V_{DS}$ increases.

Minimum Supply Voltage

The minimum supply voltage Vdd can be reduced to $2\max(V_{TN}, |V_{TP}|) + 3V_{DS(sat)}$ for FIG. 8(*a*).

To further reduce the supply voltage Vdd, low $V_T$ transistors are used for transistors M2, Mn1, M4, and Mp1 (FIG. 8(*b*)), and the minimum supply voltage Vdd may be reduced to $\max(V_{TN} + V_{TN,LOW}, |V_{TP} + V_{TP,LOW}|) + 3V_{DS(sat)}$.

If $V_T = 0.6V$, $V_{T,LOW} = 0.2V$, $V_{DS(sat)} = 0.15V$, the minimum voltage supply Vdd for the first case (FIG. 8(*a*)) is 1.65V, and the minimum voltage supply for the second case (FIG. 8(*b*)) is 1.25V, thereby creating a technical advantage over other designs.

Class AB Control

Figure 9:
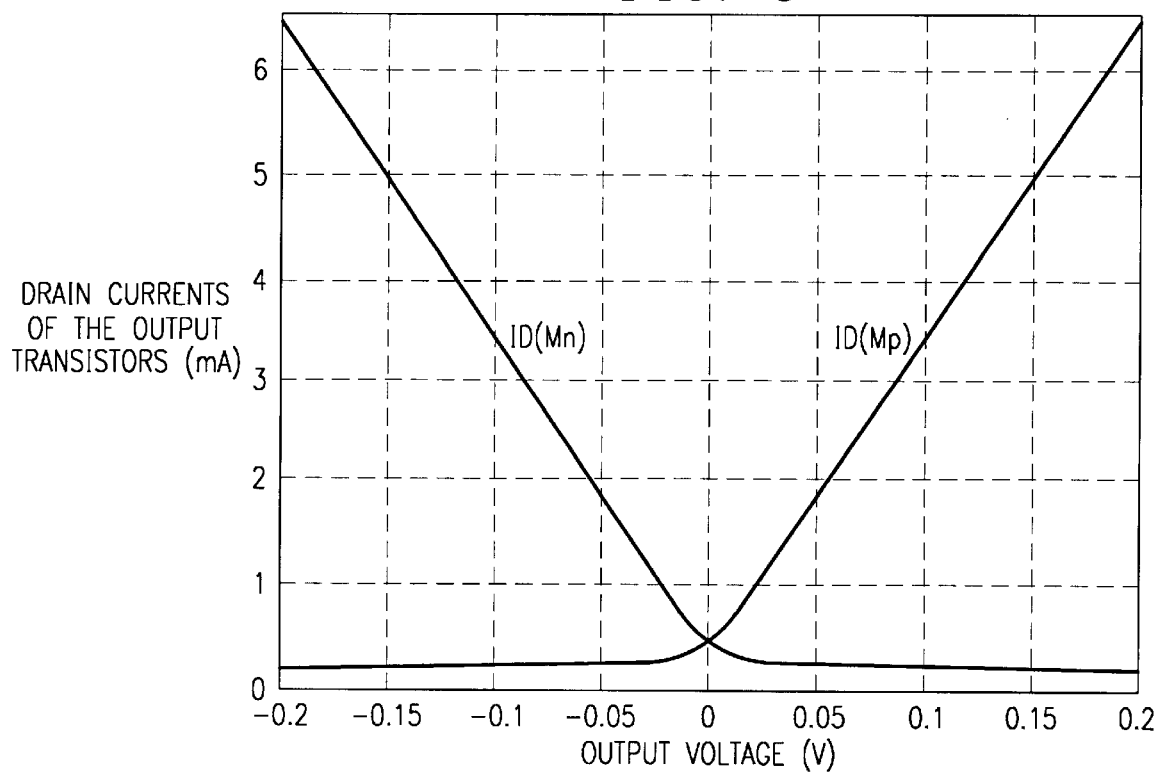
FIG. 9 illustrates the Class AB behavior of the output stage shown in FIG. 7A by TI Spice simulation.

The class AB behavior of this new output stage 80 is shown in FIG. 9 by TI Spice simulation. It is noted a very good class AB characteristic is obtained.

The accuracy of the quiescent current is mainly determined by the matching properties of bias currents, $I_{B1}$, $I_{B2}$, and $I_{B3}$, as well as the matching of the transistors.

ADVANTAGES OVER CONVENTIONAL DESIGN

Input Stage

In this design, the class AB input stage 80 have several advantages including:

The direct benefit is, with the same quiescent current consumption, a much larger output dynamic current, hence a higher slew rate. Referring to FIG. 4(*e*), assuming folded-cascode structure is used in a conventional design and the quiescent current is 90 μA, the maximum output current is 45 μA (90 μA/2). But for the structure 40 of the present invention, the maximum output current is more than 270 μA, about 6 times larger than conventional design 10.

Another advantage is flat signal/distortion v.s. frequency characteristic. As illustrated in FIG. 5, at 20 KHz, the signal/distortion performance of input stage 40 is 14.1 dB better than the conventional input circuit design 10, with the same current consumption. This feature is preserved in the extremely low THD amplifier 60 shown in FIG. 6, and a 15.4 dB advantage of signal/distortion performance is obtained at 20 KHz according to TI Spice simulation.

Output Stage

Advantageously, the output stage 80 and 82 has a fast speed, and hence a low crossover distortion. It is always stable, without worrying about the problems introduced by the quiescent feedback control loop of category (ii). Also, the design 80 and 82 of the present invention has advantages over conventional design 10 of category (i) as shown in FIG. 1. The new scheme 80 and 82 has higher over-drive gate-source voltages for the output transistors $M_p$ and $M_n$, and thus has a higher driving capacity, hence circuit 80 and 82 is more suitable to low voltage CMOS design, such as 1.8V, or even 1.5V.

Assuming that the negative supply rail is ground (0V) in FIG. 7, the most positive excursion of node X is:

$$V_{X,max} = V_{DD} - |V_{GS,Mp}| - |V_{DS(sat),Mp1,Mn1}|$$

By first order approximation, assuming all the transistors are with the same $V_{DS(sat)}$, i.e.:

$$|V_{DS(sat),Mp1,Mn1}| = V_{DS(sat)}, \; \text{and} \; |V_{GS,Mp}| = |V_{TP}| + V_{DS(sat)}$$

The maximum gate-source overdrive voltage of Mn ($V_{OV,max} = V_{GSmax} - V_T$) is given by:

$$V_{OV,max,Mn} = V_{X,max} - V_{TN} = V_{DD} - |V_{GS,Mp}| - |V_{DS(sat),Mp1,Mn1}| - V_{TN} = V_{DD} - (V_{TN} + |V_{TP}| + 2V_{DS(sat)})$$

The overdrive gate-source voltage of Mp is:

$$V_{OV,max,Mp} = V_{DD} - (V_{TN} + |V_{TP}| + 2V_{DS(sat)})$$

Advantageously, in the present invention the maximum gate-source overdrive voltages of transistors Mn and Mp are only limited by the saturation voltages of current source $I_{B2}$ and the driving circuitry. If a cascode structure is used for $I_{B2}$ and the driving circuitry:

$$V_{OV,max,Mn} = V_{DD} - (V_{TN} + 2V_{DS(sat)})$$

and $$V_{OV,max,Mp} = V_{DD} - (V_{TP} + 2V_{DS(sat)})$$

The class AB control circuitry does not introduce any degradation to $V_{OV,max,Mn}$ and $V_{OV,max,Mp}$ as compared with FIG. 7.

If the non-cascode structure is used for $I_{B2}$ and the driving circuitry, the $V_{DS(sat)}$ has further advantages:

$$V_{OV,max,Mn} = V_{DD} - (V_{TN} + V_{DS(sat)})$$

and $$V_{OV,max,Mp} = V_{DD} - (V_{TP} + V_{DS(sat)})$$

which are the maximum gate-source overdrive voltage possible for the power supply of $V_{DD}$.

Figure 10:
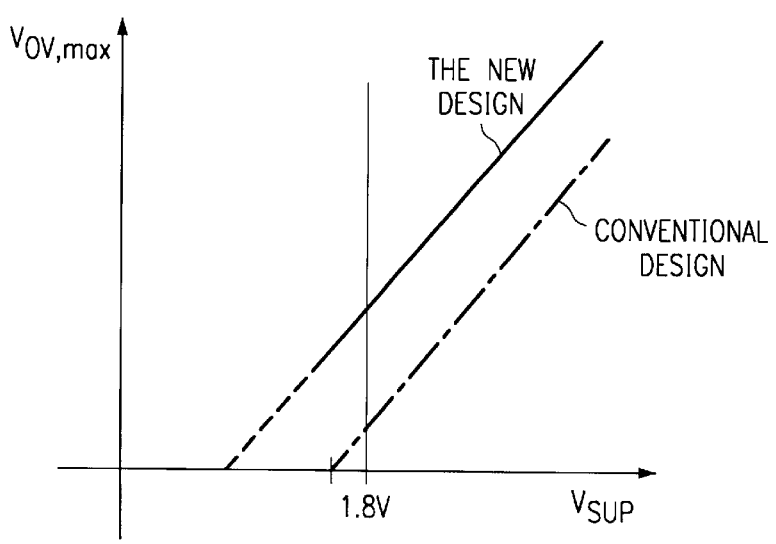
FIG. 10 illustrates for a given supply voltage of 1.8 volts, the output current driving capacity of the output stage shown in FIG. 7 is nine times higher than that of the conventional design.

Referring now to FIG. 10, the advantages of this new design is shown:

Assume $V_{TN} = |V_{TP}| = 0.6V$, $V_{DS(sat)} = 0.15V$, for supply voltage of 1.8V, the overdrive voltage for output transistors in the conventional class AB output stage (FIG. 2) is 0.3V, but for this new design 80, it is 0.9V (or even 1.05V if non-cascode is used for $I_{B1}$ and the driving circuitry of previous stage).

By $1^{st}$ order approximation, if the output transistors work in saturation region and square law of FET input output characteristic stands, the maximum output current of the output transistors is given by:

$$I_{D,max} = \frac{\beta}{2} V_{OV}^2,$$

in which $\beta$ is the transconductance parameter, $$\beta = \mu C_{ox} \frac{W}{L}.$$

$$(V_{OV,max} = V_{GS,Mn,Mp,max} - V_T)$$

By the above approximation, with a supply voltage of 1.8V, the output (current) driving capacity of the new design ($V_{OV,max} = 0.9V$) is 9 times higher than that of the conventional design ($V_{OV,max} = 0.3V$). When accounting for other $2^{nd}$ order effects and ohmic (instead of saturation) region operation of the output transistors for high output swing, the driving capacity of this new design is still much better than conventional design due to the higher gate-source overdrive voltage.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. An amplifier, comprising:
   a differential pair of transistors each having a first terminal, a second terminal and a control terminal, wherein said transistor first terminals are coupled to a power source and said transistor gates form a differential signal input to said amplifier; and
   a pair of voltage buffers, one said voltage buffer coupled to an associated said transistor second terminal, wherein said voltage buffers each comprise a transistor, wherein each said voltage buffer transistor has a gate terminal, a first terminal and a second terminal, where each said voltage buffer gate terminal is coupled to said gate terminal of said differential transistor associated with the other said voltage buffer transistor, and wherein each said voltage buffer first terminal is coupled to a current source.

* * * * *